United States Patent
Hur et al.

(10) Patent No.: US 8,634,011 B2
(45) Date of Patent: Jan. 21, 2014

(54) IMAGE SENSOR USING LIGHT-SENSITIVE DEVICE AND METHOD OF OPERATING THE IMAGE SENSOR

(75) Inventors: Ji-hyun Hur, Hwaseong-si (KR); Sung-ho Park, Yongin-si (KR); I-hun Song, Seongnam-si (KR); Sang-hun Jeon, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 393 days.

(21) Appl. No.: 12/923,924

(22) Filed: Oct. 14, 2010

(65) Prior Publication Data

US 2011/0242384 A1 Oct. 6, 2011

(30) Foreign Application Priority Data

Apr. 2, 2010 (KR) ........................ 10-2010-0030510

(51) Int. Cl.
*H04N 5/335* (2011.01)

(52) U.S. Cl.
USPC ........................................................ 348/308

(58) Field of Classification Search
USPC ........................................................ 348/294
See application file for complete search history.

(56) References Cited

U.S. PATENT DOCUMENTS

| | | | |
|---|---|---|---|
| 6,906,793 B2 * | 6/2005 | Bamji et al. | 356/141.1 |
| 7,570,293 B2 * | 8/2009 | Nakamura | 348/308 |
| 2008/0303037 A1 * | 12/2008 | Irving et al. | 257/88 |
| 2009/0026512 A1 * | 1/2009 | Ha | 257/292 |

FOREIGN PATENT DOCUMENTS

| | | |
|---|---|---|
| JP | 2003-234460 | 8/2003 |
| JP | 2004-335626 | 11/2004 |
| JP | 2006-228939 | 8/2006 |
| JP | 2006-237136 | 9/2006 |
| JP | 2009-071057 | 4/2009 |
| KR | 10-2004-0095182 | 11/2004 |
| KR | 10-2009-0078552 | 7/2009 |

OTHER PUBLICATIONS

Tze-Ching Fung, et al., "Photofield-Effect in Amorphous In-GA-ZN-0 (a-IGZO) Thin-Film Transistors," *Journal of Information Display*, vol. 9, No. 4 (Dec. 2008).

\* cited by examiner

*Primary Examiner* — James Hannett
(74) *Attorney, Agent, or Firm* — Harness, Dickey & Pierce, P.L.C.

(57) ABSTRACT

Provided are an image sensor using a light-sensitive oxide semiconductor material as a light-sensitive device and a method of operating the image sensor for acquiring RGB values of incident light in the image sensor, the image sensor includes an array of a plurality of light-sensing cells wherein each of the light-sensing cells includes a light-sensitive oxide semiconductor layer that forms a channel region of an oxide semiconductor transistor. Electronic characteristics of the light-sensitive oxide semiconductor layer vary according to an amount of light irradiated onto the light-sensitive oxide semiconductor layer. Each of the light-sensing cells constitutes a single unit color pixel.

16 Claims, 7 Drawing Sheets

IMAGE SENSOR USING LIGHT-SENSITIVE DEVICE AND METHOD OF OPERATING THE IMAGE SENSOR

CROSS-REFERENCE TO RELATED APPLICATIONS

This application claims priority under 35 U.S.C. §119 from Korean Patent Application No. 10-2010-0030510, filed on Apr. 2, 2010, in the Korean Intellectual Property Office, the disclosure of which is incorporated herein in its entirety by reference.

BACKGROUND

1. Field

Example embodiments relate to an image sensor using a light-sensitive device and a method of operating the image sensor, and more particularly, to an image sensor using a light-sensitive oxide semiconductor material as a light-sensitive device and a method of operating the image sensor for acquiring RGB values of incident light in the image sensor.

2. Description of the Related Art

Image sensors are used in various fields (e.g., high-density image sensors may be used in high definition cameras, ultraviolet/infrared ray sensitive image sensors may be used in touch panels, etc.). The most popular examples of currently commercialized image sensors include charge coupled sensor (CCD) image sensors and complementary metal oxide semiconductor (CMOS) image sensors, for example. Such CCD sensors and CMOS sensors include PN junctions of a semiconductor (e.g., silicon) as the basic structures.

Currently, CCD image sensors are widely commercialized. However, CCD image sensors have complicated driving mechanisms, intensive power consumption and/or complicated fabrication processes. CMOS image sensors are being considered as the next-generation of image sensors.

A CMOS image sensor is a solid imaging device using a CMOS. Although a CMOS image sensor also uses a photo diode (similar to a CCD image sensor), fabrication processes and methods of reading signals differ for a CCD image sensor. Generally, each unit pixel of a CMOS image sensor includes a photo diode and a transistor. Therefore, an image may be embodied by sequentially detecting electric signals of each of the unit pixels by using a simple switching method. Because such a CMOS image sensor may be mass-produced by using a general semiconductor fabrication device, a CMOS image sensor features lower fabrication costs, smaller size and/or less power consumption, as compared to a CCD image sensor.

A CMOS sensor may be fabricated as a single chip together with various signal processing devices. Because an amplifier is allocated to each pixel in the conventional CMOS image sensors, the conventional CMOS image sensors exhibit noise due to differences in amplifier characteristics. However, by making various enhancements, a signal-noise ratio is significantly improved.

Recently, technical competition for improving the integration of an image sensor by applying finer processes to image sensor fabrication has increased. A larger number of image sensors with the same number of pixels may be fabricated per wafer by reducing a chip size and by applying a fine semiconductor process. As a result, costs of an image sensor may be reduced, productivity of the image sensor may be increased, and a size of a camera module may be reduced. Therefore, the reduction of a chip size and application of a fine semiconductor process may be used, for example, to manufacture a smaller camera phone. Currently, a technique for forming a unit pixel having a size of 1.4 µm may be performed, and approximately 12.25 million pixels may be embodied with an image sensor having a size of 1.25 inches.

SUMMARY

Example embodiments relate to an image sensor using a light-sensitive device and a method of operating the image sensor, and more particularly, to an image sensor using a light-sensitive oxide semiconductor material as a light-sensitive device and a method of operating the image sensor for acquiring RGB values of incident light in the image sensor.

Provided are an image sensor in which oxide semiconductor transistors are used as light-sensitive devices so that sizes of unit pixels may be further reduced, and a method of operating the same.

Provided are an image sensor capable of detecting all values of RGB components of incident light in single light-sensing cells having single light-sensing layers, and a method of operating the same.

Provided are an image sensor for detecting all values of RGB components of light incident to single light-sensing cells of the image sensor, and a method of operating the same.

Additional aspects will be set forth in part in the description which follows and, in part, will be apparent from the description, or may be learned by practice of the presented embodiments.

According to example embodiments, an image sensor may include an array of a plurality of light-sensing cells, each of which includes a light-sensitive oxide semiconductor layer. The light-sensitive oxide semiconductor layer may form a channel region of an oxide semiconductor transistor. Electronic characteristics of the light-sensitive oxide semiconductor layer vary according to an amount of light irradiated thereto. One (or a single) light-sensing cell may constitute one (or a single) unit color pixel.

For example, the light-sensitive oxide semiconductor layer may be formed of indium zinc oxide (InZnO) or gallium indium zinc oxide (GaInZnO).

The oxide semiconductor transistor may include a substrate, a gate electrode disposed on a portion of the substrate, a gate insulation film disposed on the gate electrode, the light-sensitive oxide semiconductor layer disposed on the gate insulation film, and a drain electrode and a source electrode, which are respectively disposed on two opposite (or opposing) sides of the light-sensitive oxide semiconductor layer.

The oxide semiconductor transistor may further include a transparent insulation layer disposed on a top surface of the oxide semiconductor layer, a top surface of the drain electrode and a top surface of the source electrode.

The oxide semiconductor transistor may include a substrate, a light-sensitive oxide semiconductor layer disposed on the substrate, a gate insulation film disposed on a portion of the light-sensitive oxide semiconductor layer, a gate electrode disposed on the gate insulation film, and a drain electrode and a source electrode respectively disposed on two opposite (or opposing) sides of the gate electrode on the light-sensitive oxide semiconductor layer.

Furthermore, the oxide semiconductor transistor may further include an insulation layer, which is disposed to cover the gate electrode, the drain electrode and the source electrode.

For example, the image sensor may include a light-sensing unit in which the plurality of light-sensing cells are arranged, a row decoder configured to apply control signals to the light-sensing cells in the light-sensing unit in a row-by-row manner, an analog-to-digital (AD) convertor configured to convert analog currents output by the light-sensing cells to digital signals, a column scanner configured to read digital currents output by the AD convertor in a column-by-column manner from the light-sensing cells, and a control unit configured to control operations of the row decoder and the column scanner.

For example, the control unit may sequentially apply a first, second and third gate voltage, which are different from each other, to an oxide semiconductor transistor in a particular light-sensing cell via the row decoder and may calculate values of RGB components of light incident on the particular light-sensing cell based on three drain currents corresponding to the first, second and third gate voltages.

According to example embodiments, a method of operating the image sensor as described above may include obtaining at least three drain currents by applying at least three gate voltages, which are different from each other, to an oxide semiconductor transistor in a light-sensing cell, and calculating values of RGB components of light incident on the light-sensing cell based on the three drain currents corresponding to the first, second and third gate voltages.

For example, the method may include acquiring a first drain current by applying a first gate voltage to an oxide semiconductor transistor in a light-sensing cell, acquiring a second drain current by applying a second gate voltage (which is different from the first gate voltage) to the oxide semiconductor transistor in the light-sensing cell, acquiring a third drain current by applying a third gate voltage (which is different from the first gate voltage and the second gate voltage) to the oxide semiconductor transistor in the light sensing cell, and calculating values of RGB components of light incident to the light-sensing cell based on the first, second and third drain currents.

Here, the first, second and third drain currents may be drain currents, which are increased due to incident light at the first, second and third voltages, respectively, and are obtained by subtracting drain currents measured at the first, second and third gate voltages when no light is incident from drain currents measured at the first, second and third gate voltages, respectively, when light is incident.

The first, second and third gate voltages may be selected from voltages above a threshold voltage of an oxide semiconductor transistor when red light is incident.

When the red light is incident, the first gate voltage corresponds to a voltage in a leakage region of the oxide semiconductor transistor, the second gate voltage corresponds to a sub-threshold region of the oxide semiconductor transistor and the third gate voltage corresponds to an on-current region of the oxide semiconductor transistor.

For example, calculating values of RGB components of light incident on the light-sensing cell based on the first, second and third drain currents may be performed according to a matrix (shown below), $$\begin{pmatrix} R \\ G \\ B \end{pmatrix} = \begin{pmatrix} C_R(V_{G1}) & C_G(V_{G1}) & C_B(V_{G1}) \\ C_R(V_{G2}) & C_G(V_{G2}) & C_B(V_{G2}) \\ C_R(V_{G3}) & C_G(V_{G3}) & C_B(V_{G3}) \end{pmatrix}^{-1} \begin{pmatrix} I_{ds}(V_{G1}) - I_{ds\_dark}(V_{G1}) \\ I_{ds}(V_{G2}) - I_{ds\_dark}(V_{G2}) \\ I_{ds}(V_{G3}) - I_{ds\_dark}(V_{G3}) \end{pmatrix},$$

wherein R, G and B respectively indicate intensities of red, green and blue components of the incident light, $I_{ds}(V_{G1}) - I_{ds\_dark}(V_{G1})$ indicates the first drain current, $I_{ds}(V_{G2}) - I_{ds\_dark}(V_{G2})$ indicates the second drain current, $I_{ds}(V_{G2}) - I_{ds\_dark}(V_{G2})$ indicates the third drain current, $C_R(V_{G1})$, $C_G(V_{G1})$, and $C_B(V_{G1})$ are proportional constants with respect to the values of R, G and B at the first gate voltage, $C_R(V_{G2})$, $C_G(V_{G2})$, and $C_B(V_{G2})$ are proportional constants with respect to the values of R, G and B at the second gate voltage, and $C_R(V_{G3})$, $C_G(V_{G3})$ and $C_B(V_{G3})$ are proportional constants with respect to the values of R, G and B at the third gate voltage.

The proportional constants $C_R(V_{G1})$, $C_G(V_{G1})$, $C_B(V_{G1})$, $C_R(V_{G2})$, $C_G(V_{G2})$, $C_B(V_{G2})$, $C_R(V_{G3})$, $C_G(V_{G3})$ and $C_B(V_{G3})$ are unique property values varying according to characteristics of oxide semiconductor materials of the oxide semiconductor transistor, and may be values acquired in advance through experimentation.

BRIEF DESCRIPTION OF THE DRAWINGS

These and/or other aspects will become apparent and more readily appreciated from the following description of the embodiments, taken in conjunction with the accompanying drawings of which.

DETAILED DESCRIPTION

Figure 1:
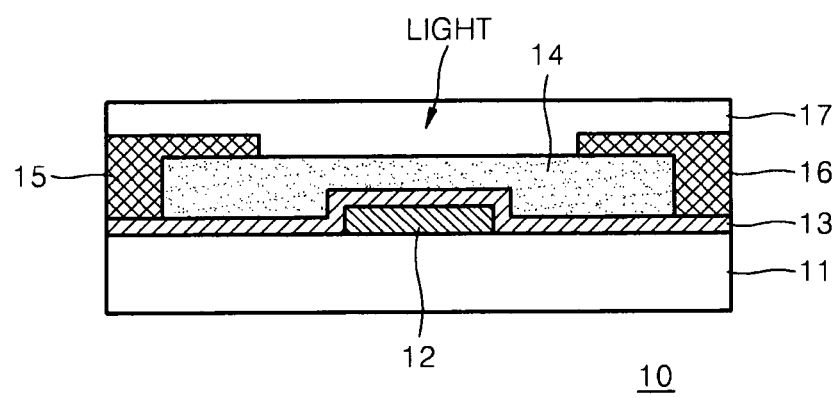
FIG. 1 a cross-sectional view showing an example of a structure of a light-sensing cell of an image sensor according to example embodiments, where the light-sensing cell has a light-sensitive oxide semiconductor transistor with a bottom gate structure as a light-sensitive device.

Various example embodiments will now be described more fully with reference to the accompanying drawings in which some example embodiments are shown. However, specific structural and functional details disclosed herein are merely representative for purposes of describing example embodiments. Thus, the invention may be embodied in many alternate forms and should not be construed as limited to only example embodiments set forth herein. Therefore, it should be understood that there is no intent to limit example embodiments to the particular forms disclosed, but on the contrary, example embodiments are to cover all modifications, equivalents, and alternatives falling within the scope of the invention.

In the drawings, the thicknesses of layers and regions may be exaggerated for clarity, and like numbers refer to like elements throughout the description of the figures.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that, if an element is referred to as being "connected" or "coupled" to another element, it can be directly connected, or coupled, to the other element or intervening elements may be present. In contrast, if an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," if used herein, specify the presence of stated features, integers, steps, operations, elements and/or components, but do not preclude the presence or addition of one or more other features, integers, steps, operations, elements, components and/or groups thereof.

Spatially relative terms (e.g., "beneath," "below," "lower," "above," "upper" and the like) may be used herein for ease of description to describe one element or a relationship between a feature and another element or feature as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

In order to more specifically describe example embodiments, various aspects will be described in detail with reference to the attached drawings. However, the present invention is not limited to example embodiments described.

Example embodiments relate to an image sensor using a light-sensitive device and a method of operating the image sensor, and more particularly, to an image sensor using a light-sensitive oxide semiconductor material as a light-sensitive device and a method of operating the image sensor for acquiring RGB values of incident light in the image sensor.

FIG. 1 is a cross-sectional view showing an example of the structure of a light-sensing cell of an image sensor according to example embodiments, where the light-sensing cell has a light-sensitive oxide semiconductor transistor with a bottom gate structure as a light-sensitive device.

A light-sensitive oxide semiconductor transistor is a transistor using a light-sensitive oxide semiconductor as a material of a channel and features threshold voltage variations based on a wavelength or an amount of incident light.

Referring to FIG. 1, a light-sensing cell 10 of the image sensor may include a substrate 11, a gate electrode 12 formed on a portion of the substrate 11, a gate insulation film 13 covering the substrate 11 and the gate electrode 12, an oxide semiconductor layer 14 covering a portion of the gate insulation film 13, and a drain electrode 15 and a source electrode 16 respectively formed on two opposite (or opposing) sides of the oxide semiconductor layer 14. A transparent insulation layer 17 may be disposed on a top surface of the oxide semiconductor layer 14, a top surface of the drain electrode 15 and a top surface of the source electrode 16.

Here, the gate electrode 12, the drain electrode 15 and the source electrode 16 may be formed of a transparent conductor (e.g., ITO or IZO), or may be formed of a general metal. The gate insulation film 13 and the insulation layer 17 may be formed of a transparent insulation material (e.g., silicon oxide, $SiO_2$). The oxide semiconductor layer 14, which functions as a channel region, may be formed of a light-sensitive oxide material. Electrical characteristics of the oxide semiconductor layer 14 change according to an intensity of incident light. For example, the oxide semiconductor layer 14 may be formed of a zinc oxide. (ZnO)-based oxide semiconductor, or an oxide semiconductor containing ZnO and at least one of indium (In), gallium (Ga), hafnium (Hf), and the like (e.g., indium zinc oxide (InZnO) or gallium indium zinc oxide (GaInZnO)).

In the light-sensing cell 10 of the image sensor shown in FIG. 1, light may pass through the transparent insulation layer 17 and may be incident on the oxide semiconductor layer 14.

Figure 2:
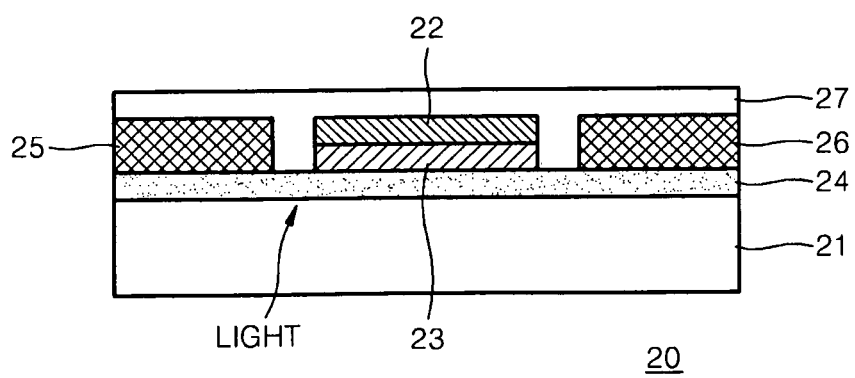
FIG. 2 a cross-sectional view showing an example of the structure of a light-sensing cell of an image sensor according to example embodiments, where the light-sensing cell has a light-sensitive oxide semiconductor transistor with a top gate structure as a light-sensitive device.

FIG. 2 is a cross-sectional view showing an example of the structure of a light-sensing cell of an image sensor according to example embodiments, where the light-sensing cell has a light-sensitive oxide semiconductor transistor with a top gate structure as a light-sensitive device.

Referring to FIG. 2, a light-sensing cell 20 of the image sensor may include a substrate 21, an oxide semiconductor layer 24 formed on the substrate 21, a gate insulation film 23 formed on a portion of the oxide semiconductor layer 24, a gate electrode 22 formed on the gate insulation film 23, a drain electrode 25 and a source electrode 26 respectively formed on two opposite (or opposing) sides of the gate electrode 22 and on the oxide semiconductor layer 24, and an insulation layer 27 covering the gate electrode 22, the drain electrode 25 and the source electrode 26.

In the light-sensing cell 20 of the image sensor shown in FIG. 1, light may pass through the substrate 21 and may be incident to the oxide semiconductor layer 24. In this case, the substrate 21 may be formed of a material transparent with respect to visible rays. However, the gate electrode 22, the gate insulation film 23, the drain electrode 25, the source electrode 26 and the insulation layer 27 may or may not be transparent. Alternatively, light may pass through the insulation layer 27 and may be incident to the oxide semiconductor layer 24. In this case, the gate electrode 22, the gate insulation film 23, the drain electrode 25, the source electrode 26 and the insulation layer 27 may be formed of a transparent material.

In the structures as described above, when light is incident on the oxide semiconductor layers 14 and 24 of the light-sensing cells 10 and 20, the threshold voltages of gates go down and drain currents increase. Therefore, an intensity of incident light may be measured by measuring a drain current at a particular gate voltage. In particular, the shorter the wavelength of incident light, the lower the threshold voltage of a gate.

Figure 3:
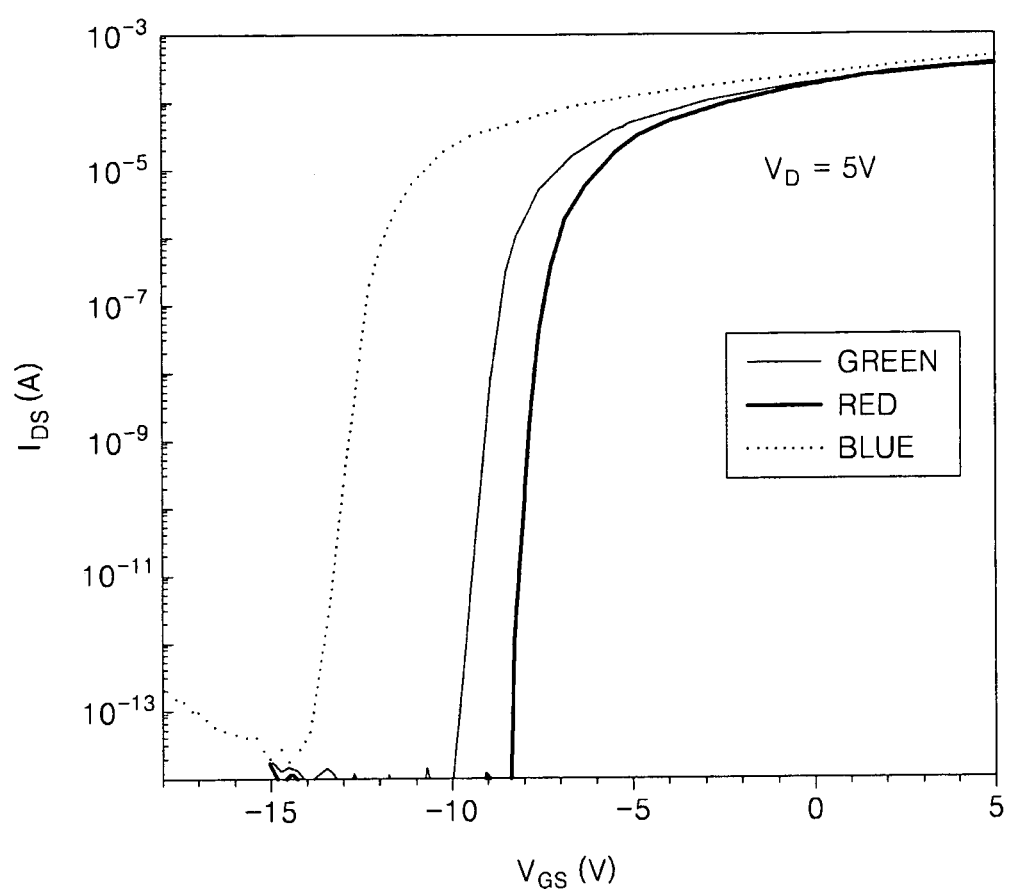
FIG. 3 is a transfer curve graph showing an example of operation characteristics of a light-sensitive oxide semiconductor transistor according to example embodiments, where the operation characteristics are based on RGB wavelengths of incident light.

FIG. 3 is a transfer curve graph showing an example of the operation characteristics of a light-sensitive oxide semiconductor transistor according to example embodiments, where the operation characteristics are based on RGB wavelengths of incident light.

Referring to FIG. 3, with respect to incident light of a same intensity, the threshold voltage of a gate decreases and the drain current of the same increases in the order of red, green and blue. Based on this principle, intensities of each of RGB components of incident light may be calculated with a single light-sensing cell 10 or 20 of the image sensor.

Hereinafter, a method of calculating values of RGB components of incident light by using the light-sensing cells of the image sensor shown in FIGS. 1 and 2 will be described in detail.

Figure 4A:
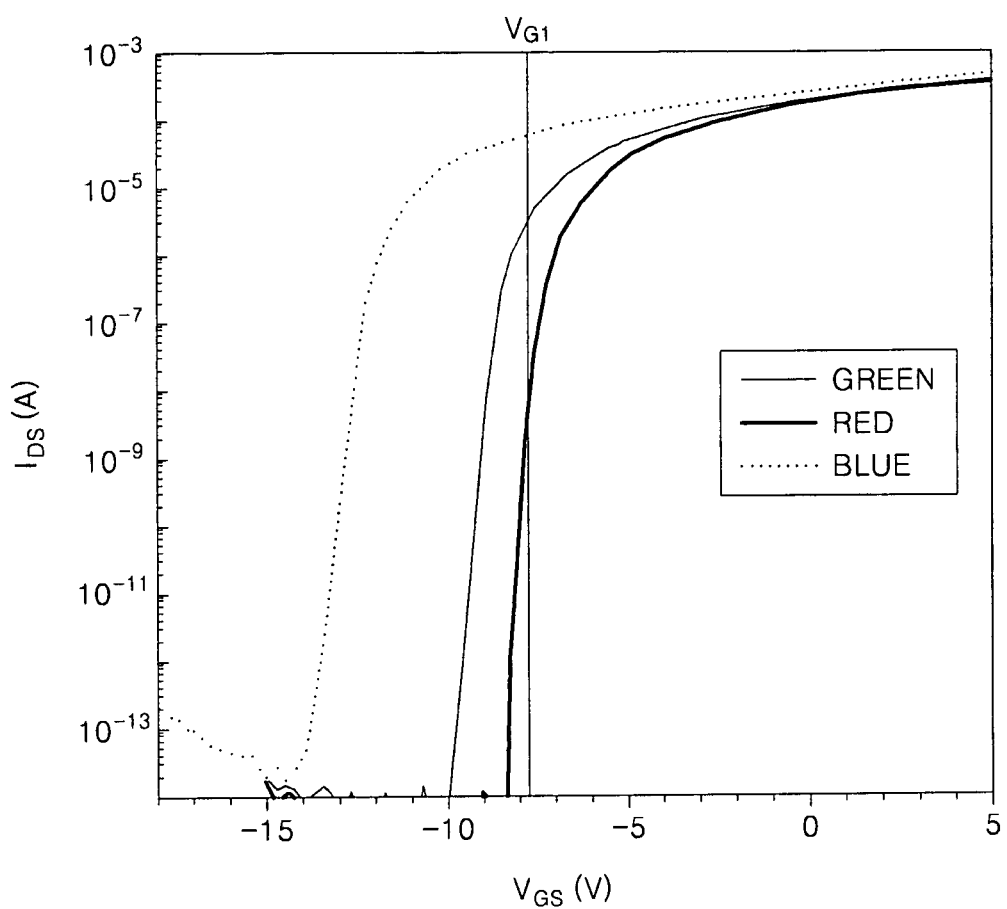
FIGS. 4A through 4C are transfer curve graphs showing an operation method for obtaining RGB values of light incident to an image sensor according to example embodiments.
Figure 4B:
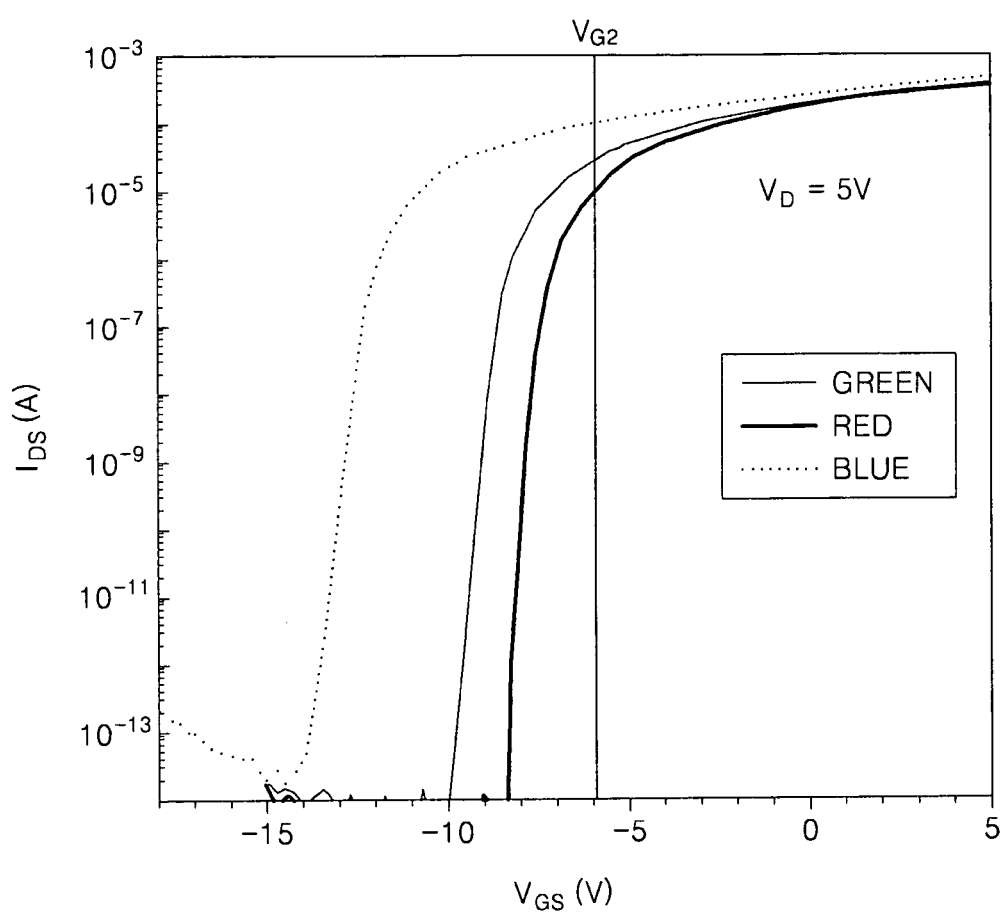
Figure 4C:
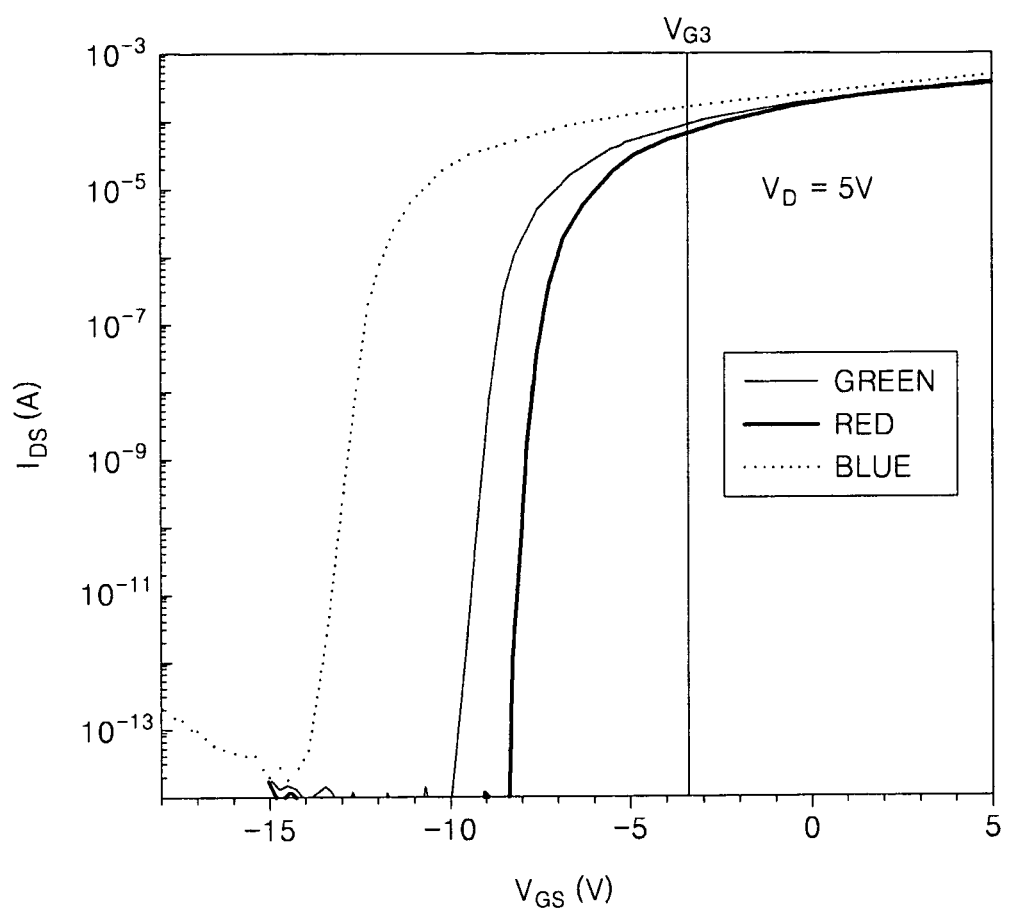

FIGS. 4A through 4C are transfer curve graphs showing an operation method for obtaining RGB values of light incident to an image sensor according to example embodiments.

Referring to FIG. 4A, a first gate voltage $V_{G1}$ is applied to the gate electrodes 12 and 22 and a drain current is measured. Generally, a photo current induced by light in a light-sensitive oxide semiconductor transistor is proportional to the amount of incident light. When a drain current measured at the first gate voltage $V_{G1}$ is indicated as $I_{ds}(V_{G1})$, a first drain current increased due to incident light may be expressed as shown in Equation (1) below.

$$I_{ds}(V_{G1}) - I_{ds\_dark}(V_{G1}) = C_R(V_{G1})R + C_G(V_{G1})G + C_B(V_{G1})B \quad \text{EQUATION (1)}$$

Here, the $I_{ds\_dark}(V_{G1})$ indicates a drain current measured at the first gate voltage $V_{G1}$ while light is not incident, and the $I_{ds}(V_{G1}) - I_{ds\_dark}(V_{G1})$ indicates the first drain current at the first gate voltage $V_{G1}$, which increases due to incident light. R, G and B indicate intensities of red, green and blue components of the incident light, respectively, which are values to be calculated by using the method according to example embodiments. $C_R(V_{G1})$, $C_G(V_{G1})$ and $C_B(V_{G1})$ respectively indicate proportional constants at the first gate voltage $V_{G1}$ with respect to the values of R, G and B. The values of the proportional constants are unique property values varying according to characteristics of oxide semiconductor materials, and may be acquired in advance through experimentation. For example, $C_R(V_{G1})$ may be acquired by incidenting pure red light onto the light-sensing cells 10 and 20 of the image sensor and measuring a drain current at the first gate voltage $V_{G1}$. In the same regard, $C_G(V_{G1})$ may be acquired by incidenting pure green light onto the light-sensing cells 10 and 20 of the image sensor and by measuring a drain current at the first gate voltage $V_{G1}$. $C_B(V_{G1})$ may be acquired by incidenting pure blue light onto the light-sensing cells 10 and 20 of the image sensor and by measuring a drain current at the first gate voltage $V_{G1}$.

Referring to FIG. 4B, a second gate voltage $V_{G2}$, which is different from the first gate voltage $V_{G1}$, is applied to the electrodes 12 and 22 and a drain current is measured. When a drain current measured at the second gate voltage $V_{G2}$ is indicated by $I_{ds}(V_{G2})$, a second drain current that increases due to incident light may be expressed as shown in Equation (2) below.

$$I_{ds}(V_{G2}) - I_{ds\_dark}(V_{G2}) = C_R(V_{G2})R + C_G(V_{G2})G + C_B(V_{G2})B \quad \text{EQUATION (2)}$$

Here, the $I_{ds\_dark}(V_{G2})$ indicates a drain current measured at the second gate voltage $V_{G2}$ while light is not incident, and the $I_{ds}(V_{G2}) - I_{ds\_dark}(V_{G2})$ indicates the second drain current at the second gate voltage $V_{G2}$, which increases due to incident light. $C_R(V_{G2})$, $C_G(V_{G2})$ and $C_B(V_{G2})$ respectively indicate proportional constants at the second gate voltage $V_{G2}$ with respect to the values of R, G and B. As described above, the values of the proportional constants are unique property values varying according to characteristics of oxide semiconductor materials, and may be acquired in advance through experimentation.

Referring to FIG. 4C, a third gate voltage $V_{G3}$, which is different from the first gate voltage $V_{G1}$ and the second gate voltage $V_{G2}$, is applied to the electrodes 12 and 22 and a drain current is measured. When a drain current measured at the third gate voltage $V_{G3}$ is indicated by $I_{ds}(V_{G3})$, a third drain current increased due to incident light may be expressed as shown in Equation (3) below.

$$I_{ds}(V_{G3}) - I_{ds\_dark}(V_{G3}) = C_R(V_{G3})R + C_G(V_{G3})G + C_B(V_{G3})B \quad \text{EQUATION (3)}$$

Here, the $I_{ds\_dark}(V_{G3})$ indicates a drain current measured at the third gate voltage $V_{G3}$ while light is not incident, and the $I_{ds}(V_{G3}) - I_{ds\_dark}(V_{G3})$ indicates the third drain current at the third gate voltage $V_{G3}$, which increases due to incident light. $C_R(V_{G3})$, $C_G(V_{G3})$ and $C_B(V_{G3})$ respectively indicate proportional constants at the third gate voltage $V_{G3}$ with respect to the values of R, G and B. As described above, the values of the proportional constants are unique property values varying according to characteristics of oxide semiconductor materials, and may be acquired in advance through experimentation.

The first, second and third gate voltages $V_{G1}$, $V_{G2}$ and $V_{G3}$ may be arbitrarily selected voltages different from each other. However, for increased precision, voltages at a leakage region, a subthreshold region and an on-current region of the light-sensitive oxide semiconductor transistor at the time of the incidence of red light may be selected as values of the first, second and third gate voltages $V_{G1}$, $V_{G2}$ and $V_{G3}$, respectively. As shown in FIG. 3, a variation in threshold voltage is relatively small when red light is incident. In the case where light that is close to pure red light (which contains little light of other wavelengths) is incident, little data may be acquired or incorrect data may be acquired based on selections of the first, second and third gate voltages $V_{G1}$, $V_{G2}$ and $V_{G3}$. For example, in the graph shown in FIG. 3, if the first, second and third gate voltages $V_{G1}$, $V_{G2}$ and $V_{G3}$ are below −8.5V, it may be determined that light is not incident when red light is incident. In the embodiment shown in FIG. 3, the first, second and third gate voltages $V_{G1}$, $V_{G2}$ and $V_{G3}$ may be selected from voltages above −8.5V (voltages higher than the threshold voltage at the time of incident of red light).

In Equations (1), (2) and (3) above, the values $I_{ds}(V_{G1}) - I_{ds\_dark}(V_{G1})$, $I_{ds}(V_{G2}) - I_{ds\_dark}(V_{G2})$ and $I_{ds}(V_{G3}) - I_{ds\_dark}(V_{G3})$ indicating drain currents are measured values, whereas the proportional constants $C_R(V_{G1})$, $C_G(V_{G1})$, $C_B(V_{G1})$, $C_R(V_{G2})$, $C_G(V_{G2})$, $C_B(V_{G2})$, $C_R(V_{G3})$, $C_G(V_{G3})$ and $C_B(V_{G3})$ are values acquired in advance through experimentation. Because there are three variables R, G and B and three equations, values of R, G and B can be obtained. For example, Equations (1), (2) and (3) may be expressed as a matrix as shown below in Equation (4).

$$\begin{pmatrix} I_{ds}(V_{G1}) - I_{ds\_dark}(V_{G1}) \\ I_{ds}(V_{G2}) - I_{ds\_dark}(V_{G2}) \\ I_{ds}(V_{G3}) - I_{ds\_dark}(V_{G3}) \end{pmatrix} = \begin{pmatrix} C_R(V_{G1}) & C_G(V_{G1}) & C_B(V_{G1}) \\ C_R(V_{G2}) & C_G(V_{G2}) & C_B(V_{G2}) \\ C_R(V_{G3}) & C_G(V_{G3}) & C_B(V_{G3}) \end{pmatrix} \begin{pmatrix} R \\ G \\ B \end{pmatrix} \quad \text{EQUATION (4)}$$

Based on the matrix above, values of R, G and B may be calculated as shown below in Equation (5).

$$\begin{pmatrix} R \\ G \\ B \end{pmatrix} = \begin{pmatrix} C_R(V_{G1}) & C_G(V_{G1}) & C_B(V_{G1}) \\ C_R(V_{G2}) & C_G(V_{G2}) & C_B(V_{G2}) \\ C_R(V_{G3}) & C_G(V_{G3}) & C_B(V_{G3}) \end{pmatrix}^{-1} \begin{pmatrix} I_{ds}(V_{G1}) - I_{ds\_dark}(V_{G1}) \\ I_{ds}(V_{G2}) - I_{ds\_dark}(V_{G2}) \\ I_{ds}(V_{G3}) - I_{ds\_dark}(V_{G3}) \end{pmatrix} \quad \text{EQUATION (5)}$$

Therefore, all of values of RGB components of incident light may be calculated by solving the matrix suggested in Equation (5) above. The calculation may be performed in a control unit 105 (shown in FIG. 6), for example.

Figure 5:
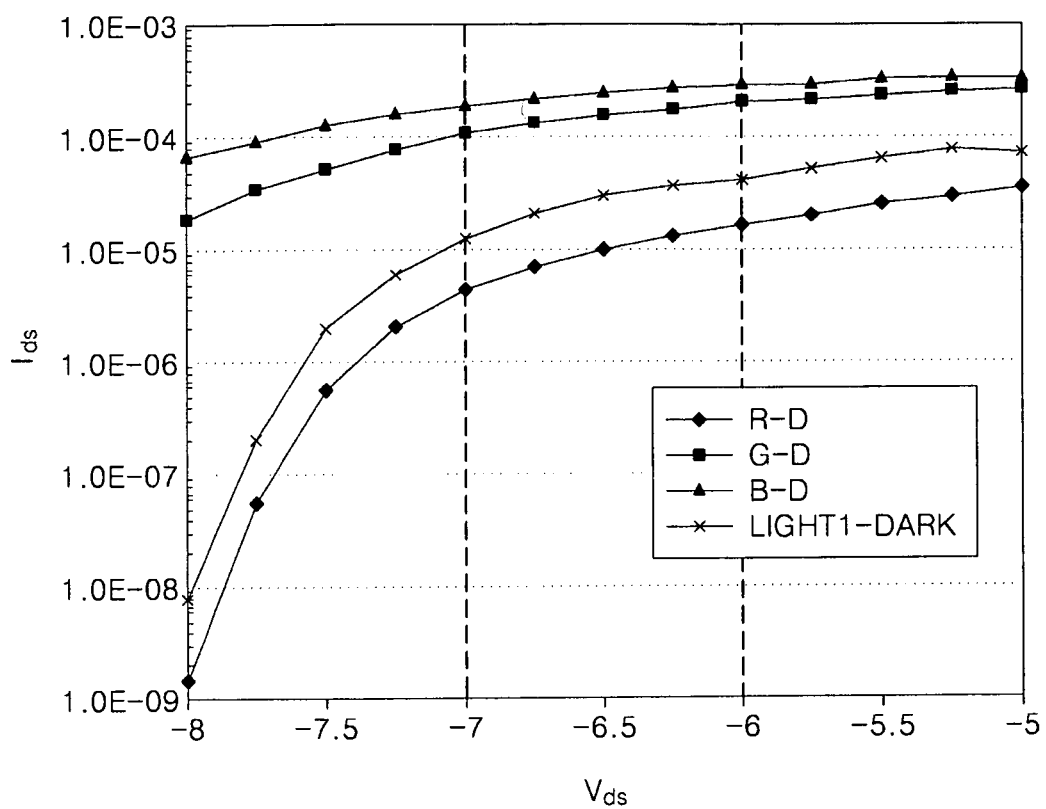
FIG. 5 is a transfer curve graph with respect to example light incident on light-sensing cells of an image sensor according to example embodiments.

FIG. 5 is a transfer curve graph with respect to example light incident on the light sensing cells of the image sensor according to example embodiments.

In FIG. 5, '▲' indicates a transfer curve with respect to pure blue light, '■' indicates a transfer curve with respect to pure green light, '♦' indicates a transfer curve with respect to pure red light, and 'x' indicates a transfer curve with respect to the example light with unknown values of RGB components. Values of RGB components (R, G, B)=(1.581, 0.0534, 0.0023) can be obtained by sequentially applying the first, second and third gate voltages $V_{G1}$, $V_{G2}$ and $V_{G3}$, which are respectively −5V, −6V and −7V, to the oxide semiconductor transistors in the light-sensing cell 10 and 20 of image sensor and by calculating the matrix of Equation (5). In FIG. 5, the example light exhibits a transfer curve characteristic close to that of the pure red light, and an actually calculated result shows that pure red light occupies the major proportion of the random light indicated by 'x'.

Based on this principle described above, an image sensor capable of detecting all values of RGB components of incident light may be embodied with a single light-sensing cell having a single light-sensing layer.

In the case of a general complementary metal oxide semiconductor (CMOS) image sensor, a plurality of light-sensing cells each having different color filters for detecting RGB components of incident light are necessary. Generally, four photodiode cells arranged in a square array constitute a single RGB pixel. For example, in a single unit RGB pixel, two photodiode cells constitute a green cell having a green color filter in a diagonal direction, whereas the other two photodiode cells constitute a red cell and a blue cell, which respectively have a red color filter and a blue color filter, in the other diagonal direction. Therefore, even if sizes of photodiodes and driving circuits therefor are reduced, there are limits in reduction of the entire size of a unit RGB cell due to the limits of current integration techniques. Although a technique for forming a plurality of light-sensing layers stacked within a single light-sensing cell is suggested to overcome such limits, a fabrication process may become complicated.

However, in the image sensor suggested herein, a single cell including a single light-sensing layer is capable of detecting all RGB components of incident light and may function as a unit color pixel. Therefore, the size of a unit color pixel may be further reduced according to example embodiments. Furthermore, because no separate color filter is necessary, an image sensor fabrication process may be simplified, and fabrication costs may be reduced.

Figure 6:
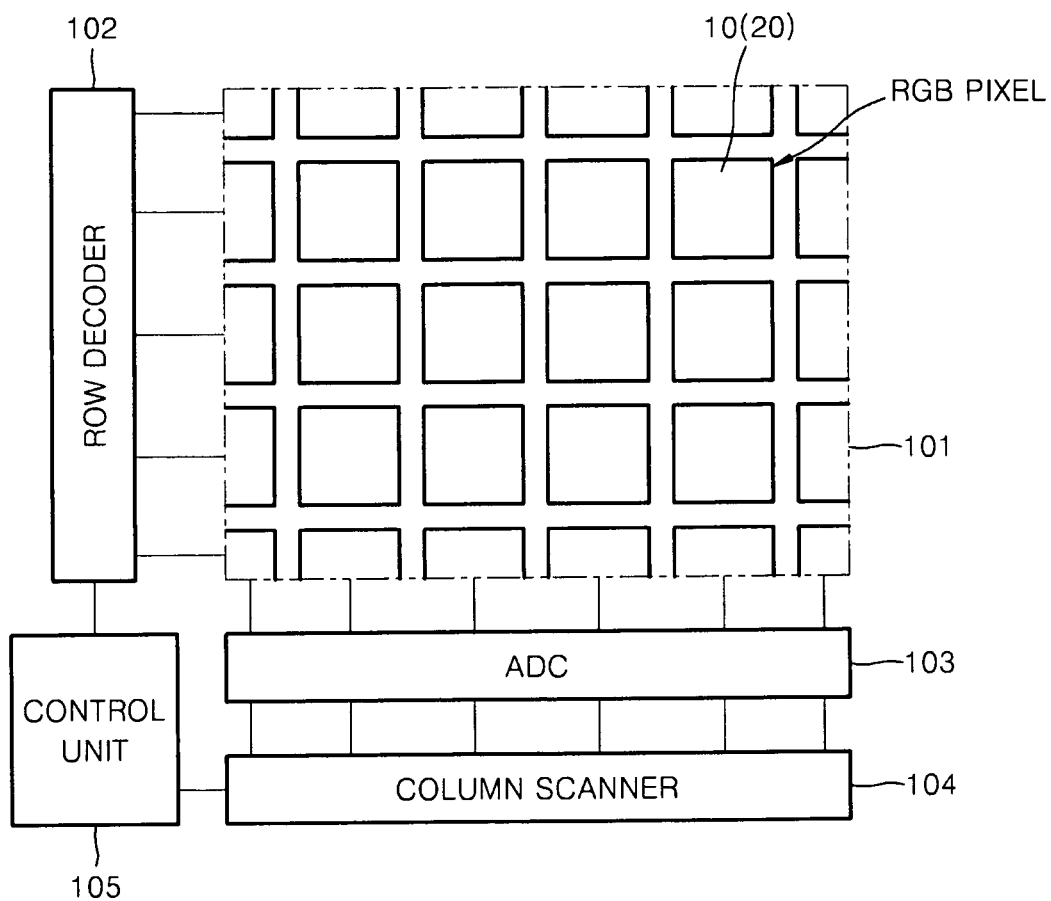
FIG. 6 is a block diagram showing an example of an image sensor according to example embodiments, where the image sensor has a matrix formation of a plurality of light-sensing cells according to example embodiments.

FIG. 6 is a block diagram showing an example of an image sensor according to example embodiments, where the image sensor has an array of a plurality of the light-sensing cells according to example embodiments.

Referring to FIG. 6, the image sensor 100 may include a light-sensing unit 101 in which the plurality of light-sensing cells 10 or 20 are arranged, a row decoder 102 configured to apply control signals (e.g. first, second and third gate voltages) to the plurality of light-sensing cells 10 or 20 in a row-by-row manner, an analog-to-digital (AD) convertor 103 configured to convert analog currents output by the light-sensing cells 10 or 20 to digital signals, a column scanner 104 configured to read digital signals output by the AD converter 103 in a column-by-column manner from the light-sensing cells 10 or 20, and a control unit 105 configured to control operations of the row decoder 102 and the column scanner 104.

As shown in FIG. 6, the plurality of light-sensing cells 10 or 20 are 2-dimensionally arranged in columns and rows. Here, the single light-sensing cell 10 or 20 functions as a single unit color (RGB) pixel. The row decoder 102 sequentially applies control signals to the light-sensing cells 10 or 20 of the light-sensing unit 101 row-by-row according to control(s) of the control unit 105. Outputs are generated row-by-row from the light-sensing cells 10 or 20. For example, the control unit 105 may control the row decoder 102 to apply first, second and third gate voltages, which are different from each other, to an oxide semiconductor transistor in the light-sensing cell 10 or 20. The column scanner 104 sequentially reads outputs column-by-column from the light sensing unit 101 according to control of the control unit 105. Outputs of the particular light-sensing cell 10 or 20 may be sequentially detected. Based on output values received from the column scanner 104 (e.g., three drain currents corresponding to the first, second and third gate voltages), the control unit 105 may calculate values of RGB components of light incident on the particular light-sensing cell 10 or 20 according to the matrix shown in Equation (5) above.

Various example embodiments are described above and shown in attached drawings to help gain an understanding of an image sensor using a light-sensitive device and a method of operating the same. Example embodiments of the image sensor may be applied to a digital camera, a camcorder, a mobile phone, a mobile electronic device or the like.

However, it should be understood that example embodiments described herein should be considered in a descriptive sense only and not for purposes of limitation. Descriptions of features or aspects within each example embodiment should typically be considered as available for other similar features or aspects in other example embodiments.

What is claimed is:

1. An image sensor, comprising:
   an array of a plurality of light-sensing cells, each of the light-sensing cells including a light-sensitive oxide semiconductor layer that forms a channel region of an oxide semiconductor transistor; and
   a controller configured to sequentially apply at least three gate voltages, which are different from each other, to the oxide semiconductor transistor of each of the plurality of light-sensing cells such that at least three drain currents are obtained,
   wherein the at least three gate voltages are selected from voltages above a threshold voltage of the oxide semiconductor transistor when red light is incident, and the threshold voltage is a gate voltage where the channel region forms,
   electronic characteristics of the light-sensitive oxide semiconductor layer vary according to an amount of light irradiated thereto, and
   each of the light-sensing cells constitutes a single unit color pixel.

2. The image sensor of claim 1, wherein the light-sensitive oxide semiconductor layer is formed of indium zinc oxide (InZnO) or gallium indium zinc oxide (GaInZnO).

3. The image sensor of claim 1, wherein the oxide semiconductor transistor includes:
   a gate electrode on a portion of a substrate;
   a gate insulation film on the gate electrode;
   the light-sensitive oxide semiconductor layer on the gate insulation film; and
   a drain electrode and a source electrode respectively on opposing sides of the light-sensitive oxide semiconductor layer.

4. The image sensor of claim 3, wherein the oxide semiconductor transistor further includes a transparent insulation layer on a top surface of the oxide semiconductor layer, a top surface of the drain electrode and a top surface of the source electrode.

5. The image sensor of claim 1, wherein the oxide semiconductor transistor includes:
   a light-sensitive oxide semiconductor layer on a substrate;
   a gate insulation film on a portion of the light-sensitive oxide semiconductor layer;
   a gate electrode on the gate insulation film; and
   a drain electrode and a source electrode respectively on opposing sides of the gate electrode on the light-sensitive oxide semiconductor layer.

6. The image sensor of claim 5, wherein the oxide semiconductor transistor further includes an insulation layer covering the gate electrode, the drain electrode and the source electrode.

7. The image sensor of claim 1, comprising:
   a light-sensing unit, the plurality of light-sensing cells being arranged in the light-sensing unit;
   a row decoder configured to apply control signals to the plurality of light-sensing cells in the light sensing unit in a row-by-row manner;
   an analog-to-digital (AD) convertor configured to convert analog currents output by the plurality of light-sensing cells to digital signals;
   a column scanner configured to read digital currents output by the AD convertor in a column-by-column manner from the plurality of light-sensing cells; and
   the control unit configured to control operations of the row decoder and the column scanner.

8. The image sensor of claim 7, wherein the control unit is configured to sequentially apply a first gate voltage, a second gate voltage and a third gate voltage, which are different from each other, to the oxide semiconductor transistor of each of the plurality of light-sensing cells via the row decoder, and further configured to calculate values of RGB components of light incident on each of the plurality of light-sensing cells based on three drain currents, which respectively correspond to the first, second and third gate voltages.

9. A method of operating the image sensor of claim 1, comprising:
   applying the at least three gate voltages, which are different from each other, to the oxide semiconductor transistor of each of the plurality of light-sensing cells such that the at least three drain currents are obtained; and
   calculating the values of RGB components of light incident on each of the plurality of light-sensing cells based on the at least three drain currents, which respectively correspond to the at least three gate voltages.

10. The method of claim 9, wherein applying the at least three gate voltages includes:
    acquiring a first drain current by applying a first gate voltage to the oxide semiconductor transistor in a single light-sensing cell from among the plurality of light-sensing cells;
    acquiring a second drain current by applying a second gate voltage, which is different from the first gate voltage, to the oxide semiconductor transistor in the single light-sensing cell; and
    acquiring a third drain current by applying a third gate voltage, which is different from the first gate voltage and the second gate voltage, to the oxide semiconductor transistor in the single light-sensing cell.

11. The method of claim 10, wherein calculating the values of the RGB components of the light incident on each of the plurality of light-sensing cells includes calculating values of RGB components of light incident to the single light-sensing cell based on the first, second and third drain currents.

12. The method of claim 10, wherein the first, second and third drain currents are drain currents that are increased due to incident light at the first, second and third voltages, respectively, and
    the first, second and third drain currents are obtained by subtracting drain currents measured at the first, second and third gate voltages when no light is incident from drain currents measured at the first, second and third gate voltages, respectively, when light is incident.

13. The method of claim 10, wherein the first, second and third gate voltages are selected from voltages above the threshold voltage of the oxide semiconductor transistor when red light is incident.

14. The method of claim 13, wherein, when the red light is incident, the first gate voltage corresponds to a voltage in a leakage region of the oxide semiconductor transistor, the second voltage corresponds to a voltage in a sub-threshold region of the oxide semiconductor transistor and the third voltage corresponds to a voltage in an on-current region of the oxide semiconductor transistor.

15. The method of claim 10, wherein calculating values of RGB components of light incident on each of the plurality of light-sensing cells based on the first, second and third drain currents is performed according to a matrix expressed in following Equation (5), $$\begin{pmatrix} R \\ G \\ B \end{pmatrix} = \begin{pmatrix} C_R(V_{G1}) & C_G(V_{G1}) & C_B(V_{G1}) \\ C_R(V_{G2}) & C_G(V_{G2}) & C_B(V_{G2}) \\ C_R(V_{G3}) & C_G(V_{G3}) & C_B(V_{G3}) \end{pmatrix}^{-1} \begin{pmatrix} I_{ds}(V_{G1}) - I_{ds\_dark}(V_{G1}) \\ I_{ds}(V_{G2}) - I_{ds\_dark}(V_{G2}) \\ I_{ds}(V_{G3}) - I_{ds\_dark}(V_{G3}) \end{pmatrix},$$

EQUATION (5)

wherein R, G, and B respectively indicate intensities of red, green and blue components of the incident light, $I_{ds}(V_{G1}) - I_{ds\_dark}(V_{G1})$ indicates the first drain current, $I_{ds}(V_{G2}) - I_{ds\_dark}(V_{G2})$ indicates the second drain current, $I_{ds}(V_{G2}) - I_{ds\_dark}(V_{G2})$ indicates the third drain current, $C_R(V_{G1})$, $C_G(V_{G1})$, and $C_B(V_{G1})$ are proportional constants with respect to the values of R, G, and B at the first gate voltage, $C_R(V_{G2})$, $C_G(V_{G2})$, and $C_B(V_{G2})$ are proportional constants with respect to the values of R, G, and B at the second gate voltage, and $C_R(V_{G3})$, $C_G(V_{G3})$, and $C_B(V_{G3})$ are proportional constants with respect to the values of R, G, and B at the third gate voltage.

16. The method of claim 15, wherein the proportional constants $C_R(V_{G1})$, $C_G(V_{G1})$, $C_B(V_{G1})$, $C_R(V_{G2})$, $C_G(V_{G2})$, $C_B(V_{G2})$, $C_R(V_{G3})$, $C_G(V_{G3})$ and $C_B(V_{G3})$ are unique property values varying according to characteristics of oxide semiconductor materials of the oxide semiconductor transistor, and are values acquired in advance through experimentation.

* * * * *